United States Patent
Kreiner et al.

(10) Patent No.: US 7,415,665 B2
(45) Date of Patent: Aug. 19, 2008

(54) METHODS AND SYSTEMS FOR COMPRESSING MARKUP LANGUAGE FILES

(75) Inventors: Barrett M. Kreiner, Norcross, GA (US); Ronald Perrella, Atlanta, GA (US)

(73) Assignee: AT&T Delaware Intellectual Property, Inc., Wilmington, DE (US)

( * ) Notice: Subject to any disclaimer, the term of this patent is extended or adjusted under 35 U.S.C. 154(b) by 342 days.

(21) Appl. No.: 10/342,572

(22) Filed: Jan. 15, 2003

(65) Prior Publication Data

US 2004/0139392 A1    Jul. 15, 2004

(51) Int. Cl.
*G06N 3/00* (2006.01)
(52) U.S. Cl. .................... 715/242; 715/234; 707/101
(58) Field of Classification Search ............... 715/513, 715/242, 234, 252, 254; 707/101, 1
See application file for complete search history.

(56) References Cited

U.S. PATENT DOCUMENTS

| | | | |
|---|---|---|---|
| 6,330,574 B1* | 12/2001 | Murashita | 715/513 |
| 6,635,088 B1* | 10/2003 | Hind et al. | 715/513 |
| 6,728,785 B1* | 4/2004 | Jungck | 709/247 |
| 6,763,499 B1* | 7/2004 | Friedman et al. | 715/513 |
| 6,883,137 B1* | 4/2005 | Girardot et al. | 715/513 |
| 7,013,425 B2* | 3/2006 | Kataoka | 715/513 |
| 7,043,686 B1* | 5/2006 | Maruyama et al. | 715/513 |
| 2002/0107887 A1* | 8/2002 | Cousins | 707/513 |
| 2003/0051056 A1* | 3/2003 | Pascual et al. | 709/247 |
| 2003/0149793 A1* | 8/2003 | Bannoura et al. | 709/247 |
| 2004/0059834 A1* | 3/2004 | Taylor et al. | 709/247 |
| 2005/0086639 A1* | 4/2005 | Min et al. | 717/114 |
| 2006/0085737 A1* | 4/2006 | Liu | 715/513 |

OTHER PUBLICATIONS

Arguello et al, The Xlint Project, Dec. 24, 2003, pp. 1-9.*
Mertz, Xml Matter #17: Pyx: A line-Oriented XML, Jan. 2002, pp. 1-5.*
Mertz, Compression and Streaming of XML Documents, Sep. 2001, pp. 1-10.*

* cited by examiner

*Primary Examiner*—Stephen Hong
*Assistant Examiner*—Manglesh M Patel
(74) *Attorney, Agent, or Firm*—Withers & Keys, LLC

(57) ABSTRACT

A method and system is disclosed for compressing a file comprising computer markup language. Contents of a file containing markup language, including a first and second markup language tag, are read. Data corresponding to the first and second markup language tags is identified and the first markup language tag, data and a placeholder are pushed onto a stack. A method and system of decompressing the resulting compressed document are also disclosed. The first markup language tag, data and placeholder are popped off the stack, and the second markup language tag corresponding to the first markup language tag is identified. The second markup language tag corresponding to the first markup language tag is generated, and the first markup language tag, data and second markup language tag are stored in memory.

13 Claims, 5 Drawing Sheets

METHODS AND SYSTEMS FOR COMPRESSING MARKUP LANGUAGE FILES

TECHNICAL FIELD

The disclosed systems and methods relate to computer compression, and more particularly to compression of markup language files.

BACKGROUND OF THE INVENTION

Markup language is used throughout the Internet for files containing structured information. The structured information includes both the data itself, as well as information about the data. Such a markup language is, for example, the eXtensible Markup Language (XML) or the Standard Generalized Markup Language (SGML). One of the useful traits of markup language, and XML in particular, is that it is user-defined and can therefore be implemented on any machine— in other words, the markup language is Internet browser "agnostic." Therefore, a web page administrator may set up a page using a markup language such as XML, and can be certain that any visitor to the page will be able to view the content, regardless of the visitor's browser software.

Unfortunately, this flexibility comes with a price, which is large file size. For example, XML is self-defined and easy for administrators to use because of its user-friendly textual environment. To achieve such a user-friendly environment, XML requires redundant tags and long, easy to understand references. When all such elements are combined into a file, the size of the file increases tremendously. As the size of an XML file increases, the formatting information in such a file can become a large percentage of the file's total size. When numerous XML files are transmitted over a network or other computer communications system, the system can become bogged down with the large files, which may slow system performance and cause errors.

Numerous compression schemes exist that attempt to resolve the problem of large file size due to the presence of formatting information, but such schemes are typically processor intensive and relatively expensive to implement. Many require expensive software programs, and therefore need to be run on a computer with full computing functionality, as opposed to a more specialized device, such as for example a router. Such a requirement increases system overhead associated with processing the files. Still other schemes depend upon finding repetitive sections of data of preselected minimum length within a large file and then using a shorthand reference in place of the repetitive section. A shortcoming of such systems is that compression cannot occur until such a repetitive section of data is located, and is therefore typically only effective in very large files.

What is needed is a quick and efficient method of compression that can be implemented inexpensively. Such compression preferably could begin at or near the beginning of a file containing structured information, and would achieve meaningful compression without unduly burdening the device carrying out the compression. As a result, a level of compression would not be the maximum achievable compression, but rather would be an efficiently-achievable level of compression. Also, such a method could be implemented by a specialized device, such as for example a network router, and would be simple enough that it could be performed without undue interference with the device's other functions.

SUMMARY

Applicant discloses herein systems and methods for compressing a file comprising computer markup language. According to a disclosed exemplary method, the contents of a file containing markup language are read and a first and second markup language tag are identified. Data corresponding to the first and second markup language tags is likewise identified. Thereafter, the first markup language tag, data and a placeholder which represents the second tag, are pushed onto a memory stack. Replacing the second tag with a placeholder results in a compressed data stream. The resulting compressed data may also be decompressed according to a disclosed exemplary method. The first markup language tag, data and placeholder are popped off the stack, and the second markup language tag corresponding to the first markup language tag is identified. The second markup language tag corresponding to the first markup language tag is generated, and the first markup language tag, data and second markup language tag are stored in memory.

BRIEF DESCRIPTION OF THE DRAWINGS

The foregoing summary and the following detailed description of presently preferred embodiments are better understood when read in conjunction with the appended drawings, in which.

DETAILED DESCRIPTION OF THE PREFERRED EMBODIMENTS

Figure 1:
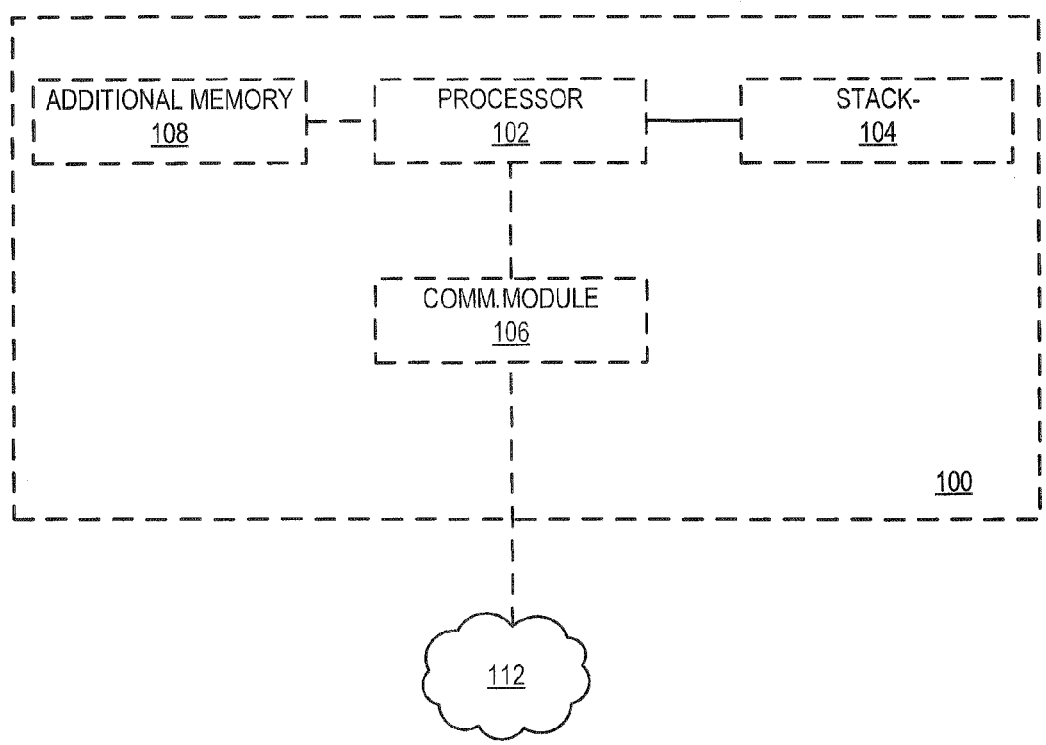
FIG. 1 is a diagram depicting an exemplary device for implementing the disclosed systems and methods.

FIG. 1 is a diagram of a computing device 100 in which aspects of the present invention may be incorporated. Device 100 may be a computer or any other type of computing device, such as for example a router, hub, web server or the like. Device 100 compressor 102 that is adapted to manipulate electronic data. Any type of processor 102 is consistent with the present invention. Processor 102 is operably connected to stack 104. Stack 104 is a memory construct or data item that is adapted to receive and store electronic data. For example, stack 104 may be a portion of random access memory (RAM). Generally, manipulation of data stored in a stack is well known. As is common in the art, the act of placing electronic data into stack 104 is referred to as pushing data onto the stack, and the act of removing electronic data from stack 104 is referred to as popping data from the stack. Stack 104 may be transmitted by the device 100 to another device by using communications electronics.

Processor 102 is optionally connected to communications module 106 that enables processor 102 to communicate with network 112. Network 112 comprises one or more devices external to device 100. Network 112 may include, for example, a personal computer, a network of computers, the Internet, or any other combination of operably connected electrical devices. Processor 102 is also optionally connected to additional memory 108, such as for example, random access memory (RAM), a hard drive, a CD-ROM drive, or the like. Additional memory 108 provides storage capability to the device 100 in addition to the storage capacity of stack 104. In one embodiment, stack 104 may exist in memory 108.

Generally, and as is explained in detail below, processor 102 is operable to read data formatted, for example, in XML, compress the data, store the compressed data in stack 104, and transmit stack 104 across network 112. Processor 102 may also comprise instructions for receiving data in the form of stack 104 from network 112, pop the data from stack 104, and decompress the data from stack 104.

Figure 2:
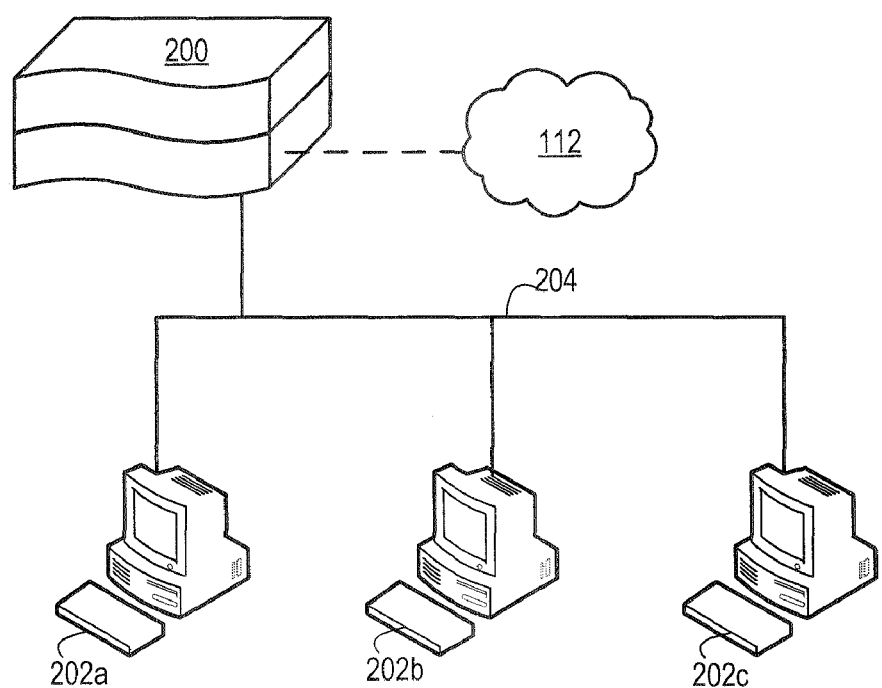
FIG. 2 is a diagram depicting an exemplary router and network for implementing aspects of the disclosed systems and methods.

FIG. 2 is an exemplary diagram of a router 200 and computer network suitable for use in implementing the disclosed systems and methods. Router 200 enables communication between computer networks and may be of conventional design or may be a specialized router expressly designed for purposes of carrying out the disclosed systems and methods. Terminals 202a-c may be computers or other electrical devices. Indeed, terminals 202a-c may be devices 100 such as is depicted in FIG. 1. Terminals 202a-c are operably connected to router 200 via communications electronics 204. Communications electronics 204 may comprise cables, hubs, servers, or the like. Alternatively, communications electronics 204 may be a wireless network. Router 200 may optionally be connected to network 112 which, as discussed above in connection with FIG. 1, comprises one or more devices external to router 200.

Network 112 may include, for example, a personal computer, a network of computers, the Internet, or any other combination of operably connected electrical devices. Network 112 may also include one or more routers in addition to the router 200. Alternate configurations of devices 100, networks 112, routers 200 and the like are possible and well known in the art, and are equally consistent with the disclosed systems. Router 200 comprises a processor and memory. Indeed, router 200 may be represented by device 100 of FIG. 1. Accordingly, in an embodiment of the disclosed system, router 200 is operable to compress and decompress data as is described below.

Figure 3:
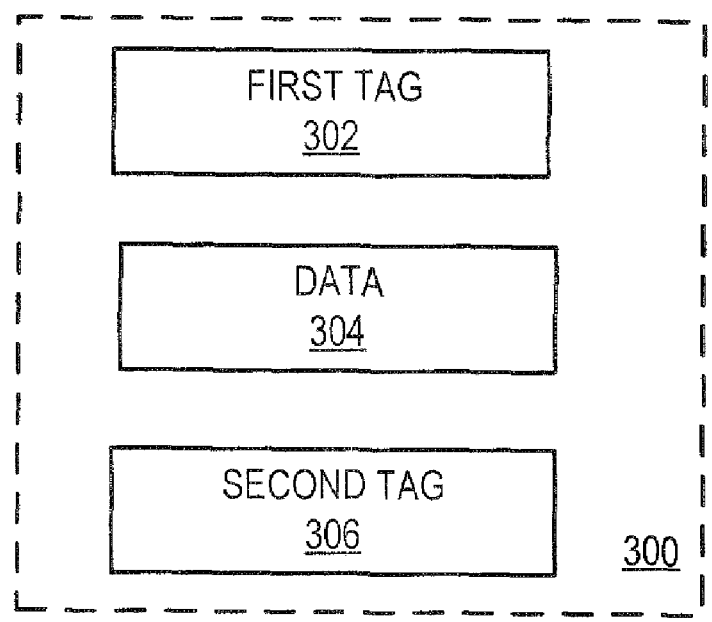
FIG. 3 is a diagram depicting an exemplary file employed in implementing aspects of the disclosed systems and methods.

FIG. 3 is a diagram depicting an exemplary file 300 employed in implementing aspects of the disclosed systems and methods. File 300 may be, for example, an XML formatted file. File 300 comprises first tag 302, which indicates a beginning of a structure, such as for example an XML element, attribute or the like. Data 304 is also contained within the file 300, and may be of any format, such as for example text, a sound, a video image or images, or the like. Second tag 306 indicates an end of the structure of data 304 designated by start tag 302.

Figure 4:
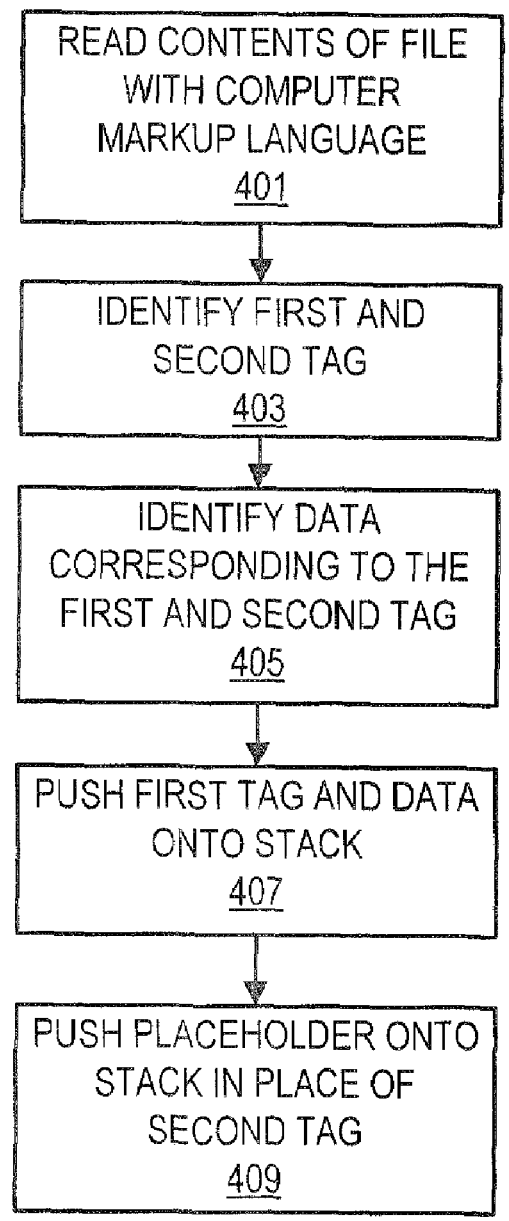
FIG. 4 is a flowchart of an exemplary method for compressing structured data.

FIG. 4 is a flowchart of an exemplary method for compressing a structured file such as file 300. At step 401, processor 102 reads the contents of file 300 with computer markup language formatted data imbedded therein. Step 401 may optionally include reading the contents of file 300 and writing the contents to additional memory 108. At step 403, processor 102 identifies first tag 302 and second tag 306. Step 403 may comprise identifying a structure associated with the first and second tags 302, 306. For example, processor 102 may identify that first tag 302 and second tag 306 together identify an XML element or attribute. At step 405, processor 102 identifies data 304 associated with first tag 302 and second tag 306. As mentioned above in connection with FIG. 3, data 304 may be text, a sound, a video image, or the like. In fact, any type of information that may be imbedded in file 300.

At step 407, processor 102 pushes first tag 302 and data 304 onto stack 104. Processor 102 then proceeds to step 409, at which point processor 102 pushes a placeholder onto stack 104. The placeholder may be a single bit, or other such information that is used to represent the location of second tag 306. Preferably, the placeholder is of small size relative to the size of second tag 306. Having a placeholder of small size enables the present invention to create a combination of first tag 302, data 304 and placeholder that is smaller in size and occupies less memory than a combination of first tag 302, data 304 and second tag 306. After steps 401-409 are performed, therefore, a compressed representation of file 300 is present on stack 104.

Generally, the compression of FIG. 4 may be performed by device 100 which, as mentioned above, may be any computing system. Indeed, the compression of FIG. 4 may be performed by router 200. After file 300 has been compressed it can be efficiently transmitted over a network such as network 112. Thereafter, the compressed data can be decompressed as is described below with reference to FIG. 5.

Figure 5:
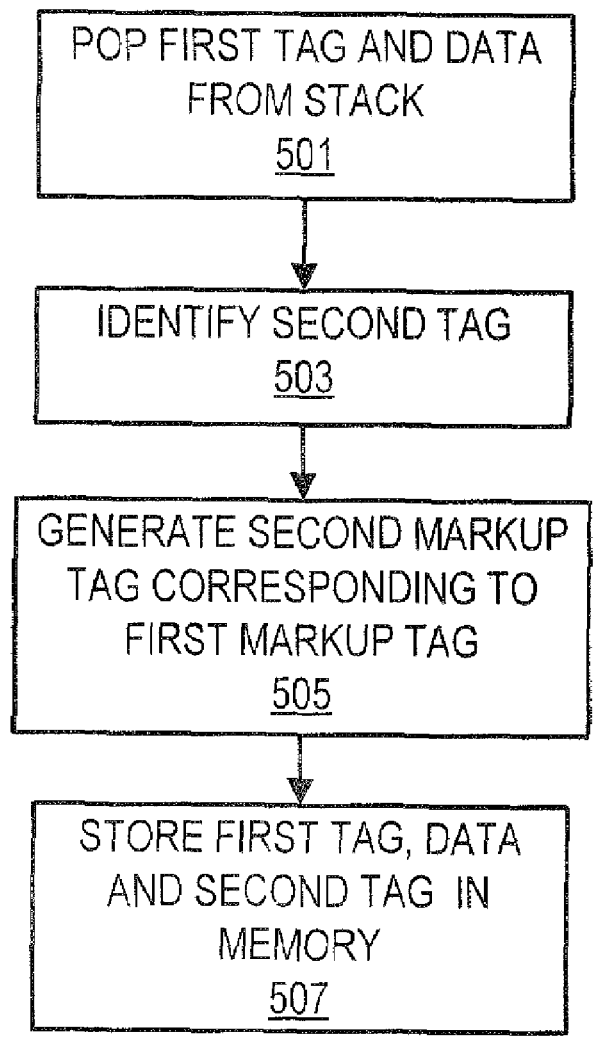
FIG. 5 is a flowchart of an exemplary method for decompressing a compressed version of structured data.

FIG. 5 is a flowchart of an exemplary method for decompressing a compressed version of structured data. At step 501, processor 102 or another processor that is operably connected to stack 104, such as for example a device that is located in the network 112, pops first tag 302, data 304 and the placeholder from stack 104. At step 503, processor 102 recognizes the placeholder as representing the end of data 304 and that data 304 has a structure defined by first tag 302 and second tag 306. At step 505, processor 102 generates second tag 306 corresponding to first tag 302. For example, if first tag 302 is a start tag corresponding to a particular attribute, second tag 306 that is generated will be an end tag corresponding to that attribute. Second tag 306 replaces the placeholder and thus decompresses file 300.

At step 507, processor 102 stores first tag 302, data 304 and second tag 306 in memory. Such memory may comprise a CD-ROM, hard drive, RAM, or the like. Indeed, memory may comprise additional memory 108 or stack 104. Generally, the decompression of FIG. 5, like the compression of FIG. 4, may be performed by any computing system such as for example device 100, or even router 200.

The decompression discussed in connection with FIG. 5 can take place at any time after the compression discussed in connection with FIG. 4. For example, the compressed file may immediately be sent to a second device 100 where the compressed file is decompressed into a second file equivalent to the file 300. Compressing the file prior to transmitting the file enhances the transmission rate. Alternatively, the compressed file may be stored for an indefinite period of time before it is decompressed. Also, the compression steps of FIG. 5 may be carried out by the router 200 or another device 100.

In an exemplary embodiment of the disclosed systems and methods file 300 is an XML formatted file. Thus, a data item such as an XML file that has been compressed in accordance with FIG. 4 may, after being transmitted across a network, be decompressed as depicted in FIG. 5. An exemplary XML file is as follows:

```
<Greeting>
    say hello
</Greeting>
<Closing>
    say goodbye
</Closing>
```

The exemplary XML file comprises two XML elements—a greeting element and a closing element. Each element is defined by a start tag, data, and an end tag. For example, with respect to the greeting element, the start tag is represented by <Greeting>, the data string is "say hello," and the end tag is </Greeting>. The exemplary XML file contains two sets of first tags 302, data 304 and second tags 306 that are listed sequentially. However, there is no limitation on the arrangement of first tags 302, data 304 and second tags 306. In fact, any arrangement of first tags 302, data 304 and second tags 306 including, but not limited to, nested arrangements is suitable for use in the disclosed systems and methods.

Table 1 provides a representation of the exemplary XML file placed on stack 104 of an exemplary device 100. The Operation column of Table 1 denotes the action of processor 102 in pushing the information onto stack 104. The Operand column denotes the particular operation in the structured file that is being placed onto stack 104. Columns Size (Original) and Size (Compressed) represent the byte size for each operand in original and compressed states. In the described system, when the data is compressed, second tags 306, such as </Greeting> or </Closing>, are represented by a placeholder on stack 104. As shown in Table 1, the placeholder is assigned a single bit, but any size placeholder may be used, provided that it is smaller in size or memory occupied than the second tag 306 it replaces. The size in bytes of original file 300, with the second tags present instead of placeholders, is calculated in the Size (Original) column. The size in bytes of the resulting compressed file is indicated by the Size (Compressed) column. As can be seen from the Total Size calculation in Table 1, the size in bytes of original file 300 has been reduced in the compressed file by 13 bytes.

TABLE 1

| Operation | Operands | Size (Original) | Size (Compressed) |
|---|---|---|---|
| Push - Tag | Greeting | 8 | 8 |
| Push - Data | "say hello" | 8 | 8 |
| Push - Placeholder | 1 | 8 | 1 |
| Push - Tag | Closing | 7 | 7 |
| Push - Data | "say goodbye" | 10 | 10 |
| Push - Placeholder | 1 | 7 | 1 |
| TOTAL SIZE | | 48 | 35 |

Thus a system and method for compressing and decompressing files containing structured information has been disclosed. In a disclosed method, a first tag indicating a beginning of a structure of corresponding data and the data itself are pushed onto a stack, and a second tag indicating an end of said structure is replaced by pushing a placeholder onto the stack. The compressed file may be decompressed and thereby restored by popping the first tag and data from the stack, and generating a second tag in place of the placeholder.

Those skilled in the art understand that computer readable instructions for implementing the above-described processes, such as those described with reference to FIGS. 4 and 5, can be generated and stored on one of a plurality of computer readable media such as a magnetic disk or CR-ROM. Further, a general purpose computing device, such as device 100 described with reference to FIG. 1, or a router such as router 200 described in FIG. 2, may be arranged with other similarly equipped computing devices in a network, and may be loaded with computer readable instructions for performing the above described processes. Specifically, referring to FIG. 1, processor 102 may be programmed to operate in accordance with the above-described processes.

While the disclosed systems and methods have been described and illustrated with reference to specific embodiments, those skilled in the art will recognize that modification and variations may be made. For example, while a disclosed embodiment relates to XML document, alternative embodiments may refer to other types of markup language files or formats, such as SGML or the like. Accordingly, reference should be made to the appended claims as indicating the scope of the invention.

We claim:

1. A method for compressing and decompressing a file within a network router comprising computer markup language, comprising:
   reading contents of a markup language file;
   determining a single placeholder value;
   identifying a first and second markup language tag;
   identifying the data and the data structure associated with the first and second markup language tags;
   pushing the first markup language tag and the data onto a stack;
   replacing the second markup language tag with the single placeholder value, the single placeholder value indicating the end of the data and-indicating that the structure of the data is defined by at least the first markup language tag such that upon decompression the single placeholder value is directly replaced by a complement of the first markup language tag, wherein every second markup language tag throughout the file is replaced by the single placeholder value;
   pushing the single placeholder value onto the stack;
   popping the first markup language tag, the data and the single placeholder value from the stack;
   identifying by the existence of the single placeholder value that the second markup language tag is the complement to the first markup language tag;
   generating the second markup language tag that is the complement to the first markup language tag; and
   storing the data and the first and second markup language tags in memory.

2. The method of claim 1 further comprising transmitting the one markup language tag, the data and the single placeholder value.

3. The method of claim 2, further comprising receiving the one markup language tag, the data and the single placeholder value.

4. A method for compressing and decompressing a file within a network router comprising computer markup language tags, comprising:
   providing a file comprising data and at least a first tag and second tag for defining the format of the data;
   determining a single placeholder value;
   reading the first tag;
   reading the data;
   reading the second tag;
   identifying the first tag and the second tag;
   pushing the first tag onto a stack;
   pushing the data onto the stack;
   generating the single placeholder value, wherein the single placeholder value indicates the end of the data, and also indicates to a processor by existence of the single placeholder value that the structure of the data is defined by at least the first tag such that upon decompression the single placeholder value is directly replaced by the complement of the first tag;
   replacing the second tag with the single placeholder value, wherein each second tag throughout the file is replaced by the single placeholder value;

pushing the single placeholder value onto the stack;
popping the first markup language tag, the data and the single placeholder value from the stack;
identifying by the existence of the single placeholder value that the second markup language tag is the complement to the first markup language tag;
generating the second markup language tag that is the complement to the first markup language tag; and
storing the data and the first and second markup language tags in memory.

5. The method of claim 4, wherein providing a file comprises:
providing the data;
providing the first tag indicative of a beginning of a structure of the data; and providing the second tag indicative of an end of the structure of the data.

6. The method of claim 4, further comprising:
transmitting the stack comprising the first tag, the data and the single placeholder value;
receiving the stack comprising the first tag, the data and the single placeholder value;
reading the first tag;
reading the data;
reading the single placeholder value;
identifying the first tag;
regenerating the second tag as the complement of the first tag based on the reading of the single placeholder value; and
substituting the single placeholder value with the complement of the first tag.

7. An apparatus for compressing and decompressing a file within a network router comprising markup language, comprising:
an electronic file comprising a first tag, a second tag and data corresponding to the first and second tags;
a memory stack for storing electronic information;
a first processor for generating a placeholder value and using the same placeholder value in conjunction with each first tag throughout the file, pushing the first tag, the data and the placeholder value onto the memory stack, wherein the placeholder value replaces the second tag, indicates the end of the data and indicates that the structure of the data is defined by at least the first tag such that upon decompression, the placeholder value is directly replaced by a complement of the first tag;
a communications link operatively communicating with said first processor, said communications link adapted to transmit said memory stack; and
a second processor operatively communicating with said communications link, said second processor adapted to receive said memory stack from said communications link, popping the first tag and the data from the memory stack and regenerating the second tag as the complement of the first tag based partly on the reading of the placeholder value and substituting the placeholder value with a regenerated second tag.

8. The system of claim 7, wherein said second processor is further adapted to create a second file comprising the first tag, the data and the regenerated second tag.

9. The system according to claim 7, wherein the electronic file is an XML document.

10. A computer-readable medium having computer-executable instructions for performing a method for compressing and decompressing a file within a network router comprising computer markup language, the method comprising:
reading contents of a markup language file;
determining a single placeholder value;
identifying a first markup language tag and a second markup language tag;
generating the single placeholder value, wherein the single placeholder value indicates the end of the data and also indicates that the structure of the data is defined by at least the first markup language tag such that upon decompression, the single placeholder value is directly replaced by a complement of the first tag;
identifying data corresponding to the first and second markup language tags;
replacing the second markup language tag by the single placeholder value, wherein every second markup language tag throughout the file is replaced by the single placeholder value;
pushing the first markup language tag, the data and the single placeholder value onto a stack;
popping the first markup language tag, the data and the single placeholder value from the stack;
identifying by the existence of the single placeholder value that the second markup language tag is the complement to the first markup language tag;
generating the second markup language tag that is the complement to the first markup language tag; and
storing the data and the first and second markup language tags in memory.

11. The computer-readable medium of claim 10, wherein the method further comprises:
reading the first markup language tag, the data and the single placeholder value;
identifying the data corresponding to the first markup language tag and the single placeholder value;
regenerating the second markup language tag from the first markup language tag;
popping the first markup language tag and data from the stack; and
writing the data and the first and second markup language tag to a second file.

12. The computer-readable medium of claim 11, wherein the method further comprises transmitting the first markup language tag, the data and the single placeholder value.

13. The computer-readable medium of claim 12, wherein the method further comprises receiving the first markup language tag, the data and the single placeholder value.

* * * * *